United States Patent
Bromberger

(10) Patent No.: US 7,605,047 B2
(45) Date of Patent: Oct. 20, 2009

(54) METHOD FOR THE INTEGRATION OF TWO BIPOLAR TRANSISTORS IN A SEMICONDUCTOR BODY, SEMICONDUCTOR ARRANGEMENT IN A SEMICONDUCTOR BODY, AND CASCODE CIRCUIT

(75) Inventor: Christoph Bromberger, Heilbronn (DE)

(73) Assignee: Atmel Automotive GmbH, Heilbronn (DE)

( * ) Notice: Subject to any disclaimer, the term of this patent is extended or adjusted under 35 U.S.C. 154(b) by 444 days.

(21) Appl. No.: 11/366,481

(22) Filed: Mar. 3, 2006

(65) Prior Publication Data

US 2006/0199348 A1    Sep. 7, 2006

(30) Foreign Application Priority Data

Mar. 3, 2005  (DE)  ........................ 10 2005 009 725

(51) Int. Cl.
*H01L 21/331*  (2006.01)

(52) U.S. Cl. .................. 438/342; 438/343; 257/563; 257/564

(58) Field of Classification Search ......... 257/560–564; 438/338, 340, 342–343
See application file for complete search history.

(56) References Cited

U.S. PATENT DOCUMENTS

| 4,651,410 | A |   | 3/1987 | Feygenson |
| 4,717,681 | A |   | 1/1988 | Curran |
| 4,771,013 | A |   | 9/1988 | Curran |
| 4,837,177 | A | * | 6/1989 | Lesk et al. .................. 438/309 |
| 5,037,774 | A |   | 8/1991 | Yamawaki et al. |
| 5,376,821 | A |   | 12/1994 | Puzzolo et al. |

FOREIGN PATENT DOCUMENTS

| DE | 3743776 A1 | 7/1989 |
| EP | 0 493 854 A1 | 7/1992 |
| EP | 0 605 920 A1 | 7/1994 |

OTHER PUBLICATIONS

U. Tietze, CH. Schenk: "Semiconductor Circuit Technology", Springer-Verlag, Berlin, pp. 112-113.

* cited by examiner

*Primary Examiner*—Kenneth A Parker
*Assistant Examiner*—Jose R Diaz
(74) *Attorney, Agent, or Firm*—Muncy, Geissler, Olds & Lowe, PLLC

(57) ABSTRACT

A method for the integration of two bipolar transistors in a semiconductor body, wherein, for the first bipolar transistor, a first emitter semiconductor region, a first base semiconductor region, and a first collector semiconductor region are produced. A recombination layer is applied to the first bipolar transistor, which is adjacent to the first emitter semiconductor region or the first collector semiconductor region and is constructed in such a way that charge carriers recombine on the recombination layer, and next, the second bipolar transistor is placed on the recombination layer, wherein a second emitter semiconductor region, a second base semiconductor region, and a second collector semiconductor region are produced on the recombination layer, so that the second emitter semiconductor region or the second collector semiconductor region is adjacent to the recombination layer.

14 Claims, 1 Drawing Sheet

METHOD FOR THE INTEGRATION OF TWO BIPOLAR TRANSISTORS IN A SEMICONDUCTOR BODY, SEMICONDUCTOR ARRANGEMENT IN A SEMICONDUCTOR BODY, AND CASCODE CIRCUIT

This nonprovisional application claims priority under 35 U.S.C. § 119(a) on German Patent Application No. DE 102005009725, which was filed in Germany on Mar. 3, 2005, and which is herein incorporated by reference.

BACKGROUND OF THE INVENTION

1. Field of the Invention

The present invention relates to a method for the integration of two bipolar transistors in a semiconductor body, a semiconductor arrangement in a semiconductor body, and a cascode circuit.

2. Description of the Background Art

EP 0 493 854, which corresponds to U.S. Pat. No. 5,376,821, discloses vertically integrated cascode structures with two transistors for high-voltage applications. Here, a geometrically underlying transistor with a high blocking capability is vertically integrated with a geometrically overlying transistor. Arrangements of this type are employed preferably within the voltage range above 100V. The emitter region of the geometrically underlying transistor has, with the same conductivity type, a considerably higher dopant concentration than an adjacent collector drift zone of the geometrically overlying transistor. This increases the emitter effectiveness in particular of the geometrically underlying transistor. The vertical integration, for example, of two npn transistors produces a parasitic pnp transistor, so that the arrangement from EP 0 493 854 tends towards thyristor-like behavior and the collector current can be controlled only with limitations.

In EP 605 920, the tendency of the arrangement from EP 0 493 854 to thyristor-like behavior is reduced by increasing the Gummel number $G_B$ of the parasitic transistor. For this purpose, the emitter region of the bottom transistor is made as a highly doped layer, which continuously separates the base of the bottom transistor from the collector drift zone of the top transistor by producing a MESA (Table Mountain) structure. In EP 605 920, two transistors exclusively can be integrated into the MESA structure. In another embodiment, in EP 605 920 p-doped SiGe is used as an etching stop for the manufacture of the MESA structure in the base of the bottom transistor.

SUMMARY OF THE INVENTION

It is therefore an object of the present invention to provide an improved method for the integration of a semiconductor arrangement in order to improve as much as possible the high-frequency properties of the semiconductor arrangement.

This object is achieved by a method for the integration of two bipolar transistors into a semiconductor body, by a semiconductor arrangement in a semiconductor body, and by a cascode circuit.

In an embodiment, an arrangement of a recombination layer is provided between two bipolar transistors integrated vertically one over another. Therefore, in a method for the integration of two bipolar transistors in a semiconductor body, first a first emitter semiconductor region, a first base semiconductor region, and a first collector semiconductor region are produced for the first bipolar transistor.

A recombination layer, which is adjacent to the first emitter semiconductor region or the first collector semiconductor region and is constructed in such a way that charge carriers recombine on the recombination layer, is applied to the first bipolar transistor.

Next, the second bipolar transistor is placed on the recombination layer by producing a second emitter semiconductor region, a second base semiconductor region, and a second collector semiconductor region on the recombination layer, so that the second emitter semiconductor region or the second collector semiconductor region is adjacent to the recombination layer.

An embodiment of the invention provides that a silicide layer is formed as the recombination layer. Next, an amorphous semiconductor layer is applied both to the silicide layer and to an exposed monocrystalline semiconductor region adjacent to the silicide layer.

During a subsequent temperature treatment, the amorphous semiconductor layer is crystallized proceeding from the exposed monocrystalline semiconductor region, acting as a crystallization nucleus, so that the silicide layer is covered at least partially by a crystallized monocrystalline semiconductor layer.

Studies by the applicant have shown that it is possible to apply monocrystalline semiconductor regions to silicide layers without costly processes, such as: a process for growing monocrystalline silicon layers on certain silicon-lattice-matched silicides such as $ErSi_2$ or $CoSi_2$ by molecular beam epitaxy; or a process for growing layers, which include a matrix continuing the crystal lattice of the substrate epitaxially, the matrix in which non-lattice-matched silicide crystallites are embedded in a thin layer and the crystallites join together into a continuous silicide layer by subsequent annealing.

In an embodiment of the invention, the silicide layer is made of titanium as the transition metal and silicon as the semiconductor material.

In fact, a crystallization direction, exclusively vertical relative to the wafer surface, is basically possible; the amorphous semiconductor layer is also crystallized substantially at least laterally in an embodiment of the invention. This can naturally be combined advantageously with a vertical crystallization direction.

That the crystallization can occur within a temperature range between 400° C. and 600° C. Advantageously, in so doing, the temperature during the process depends on the employed silicide. Advantageously, the temperature here can be selected so that metal ions of the silicide layer do not significantly contaminate the adjacent monocrystalline semiconductor layer for the critical functioning of the semiconductor layer, or do not substantially increase the nucleation rate in the grown amorphous semiconductor layer.

The amorphous silicon layer can be applied with a layer thickness of at least 300 nm; preferably at least one region of the amorphous semiconductor layer is doped with at least one dopant, particularly with germanium, phosphorus, boron, and/or arsenic, to control the crystal growth and the nucleation rate during the manufacturing process. An embodiment of the invention provides that the dopant is introduced in a preferably 250 nm-thick surface region of the amorphous silicon layer in particular by implantation. In order to remove again this highly doped region, which interferes with the function, regions, doped with the dopant, of the crystallized monocrystalline semiconductor layer are etched selectively, particularly wet chemically, in that the regions doped with the dopant have a higher etching rate than a lower doped region of the crystallized monocrystalline semiconductor layer.

In order to produce additional active regions of a component, after the removal of the non-monocrystalline regions of the semiconductor layer, the monocrystalline layer is thickened by epitaxy, particularly by selective vertical epitaxy. This is used to form semiconductor regions of the second bipolar transistor by introducing the dopant in situ particularly during epitaxy.

Several different semiconductor layers made of different semiconductor materials, such as Si or SiGe, may be applied by epitaxial thickening. Preferably, moreover, semiconductor regions with different conduction types, n-conducting or p-conducting, are provided to form pn junctions of the bipolar transistor.

An alternative embodiment provides for the use of a metal layer as the recombination layer. In this regard, during the integration process, a metal layer, particularly made of molybdenum, is applied as the recombination layer. An amorphous semiconductor layer is then applied both to the metal layer and to an exposed monocrystalline semiconductor region adjacent to the metal layer.

During a subsequent temperature treatment, the amorphous semiconductor layer is crystallized proceeding from the exposed monocrystalline semiconductor region, acting as a crystallization nucleus, so that the metal layer is covered at least partially by a crystallized monocrystalline semiconductor layer. Molybdenum impurities here produce only a slight increase in the nucleation rate. Moreover, the silicidation temperature (~1000° C.) of molybdenum is higher than the temperature during the temperature treatment of the amorphous semiconductor layer.

Another aspect of the invention relates to a semiconductor arrangement in a semiconductor body with a first bipolar transistor and a second bipolar transistor, which are arranged vertically one over another relative to the surface of the semiconductor body.

In this regard, an emitter semiconductor region of the first bipolar transistor and a collector semiconductor region of the second bipolar transistor are adjacent to a recombination layer, which is constructed for the recombination of charge carriers at the interfaces to the emitter semiconductor region and/or to the collector semiconductor region.

At least in areas, at least one first PN junction of the first bipolar transistors is constructed parallel to at least one second PN junction of the second bipolar transistor. All PN junctions can be constructed parallel to one another at least in areas.

Another aspect of the invention is a cascode circuit, which can be constructed to amplify high-frequency signals. This cascode circuit has a first bipolar transistor in the emitter circuit and a second bipolar transistor in the base circuit.

Here, a collector semiconductor region of the first bipolar transistor can be separated by a recombination layer from an emitter semiconductor region of the second bipolar transistor. The first bipolar transistor and the second bipolar transistor are integrated vertically one over another, so that both substantially cover the same base area of the semiconductor substrate.

In a further embodiment, the recombination layer is connected via an electrically conductive connection with at least one terminal of the bipolar transistors, another integrated component, and/or with a terminal of the cascode circuit. This makes it possible, for example, to establish the potential of the recombination layer or to feed a current into the recombination layer.

Two other aspects of the invention are the applications of the semiconductor arrangement or cascode circuit as, for example, a superhigh-frequency-capable active component within a frequency range in which the transient behavior is substantially influenced by the Miller effect, or as a high-blocking active component within a voltage range in which the transient behavior is determined substantially by the transit time through the space-charge region between the collector and the base of at least one transistor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Electron-hole pairs can be injected in different ways in a semiconductor. Independent of the injection method, these charge carriers recombine at a rate which at low additional concentrations is proportional to their instantaneous concentration. The resulting exponential decline of the injected, excess charge carriers proceeds with a time constant, which is defined as the charge carrier lifetime.

The injected electron-hole pairs due to electrical and magnetic fields or their own concentration gradients contribute to a carrier motion, therefore to the electrical current, which is associated with an increase in conductivity. During this carrier motion, they recombine either directly (band-band) or due to recombination centers such as defects, lattice vacancies, etc., in the semiconductor or on one of its surfaces or interfaces with other materials.

Preferably, foreign substances, which lead to defects in a semiconductor, which occur approximately in the middle of the band pattern, act as recombination centers and have an effect on the lifetime of the charge carrier. Because the recombination rate is determined by the charge carrier type whose concentration is the lowest, the decline in the excess charge carrier concentration occurs due to the recombination of the minority carrier in the specific semiconductor region.

Figure 1:
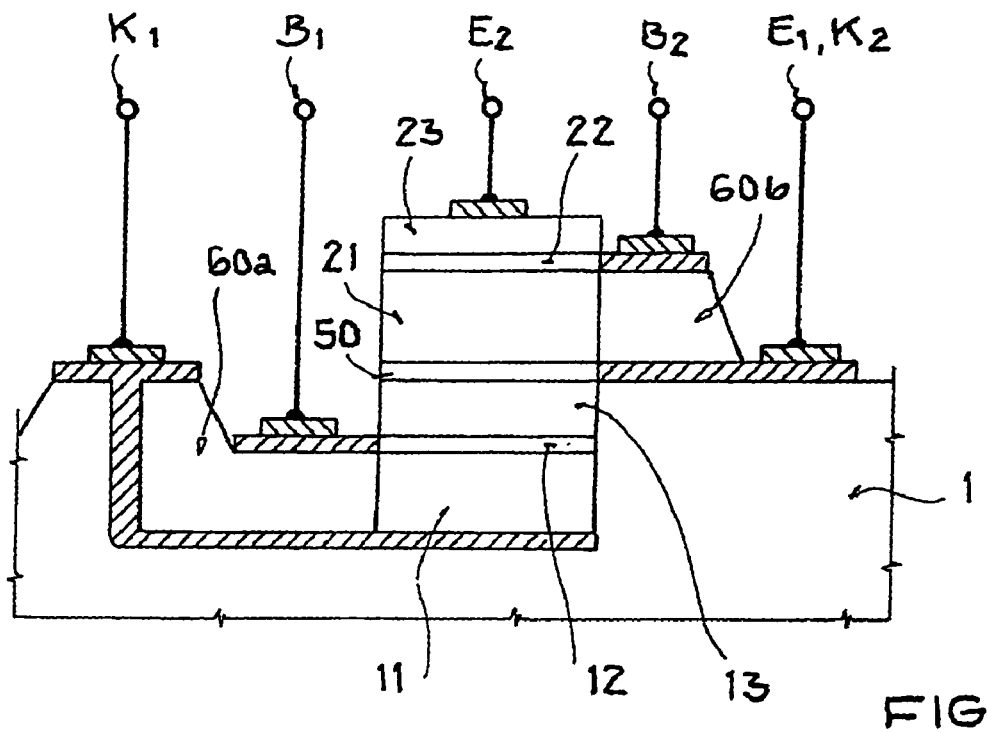
FIG. 1 is a schematic sectional drawing of a semiconductor arrangement.

A sectional view through a semiconductor arrangement is shown in FIG. 1. A cascode arrangement with two bipolar transistors is integrated into a monocrystalline silicon substrate 1. The first transistor thereby has a first collector semiconductor region 11, a first base semiconductor region 12, and an emitter semiconductor region 13. The second transistor analogously has a second collector semiconductor region 21, a second base semiconductor region 22, and a second emitter semiconductor region 23. In FIG. 1, for the sake of simplicity, the semiconductor regions 11, 12, 13, 21, 22, and 23 are shown with the same structure.

A recombination layer 50 as a recombination center for charge carriers of first emitter semiconductor region 13 and of second collector semiconductor region 21 is placed between first emitter semiconductor region 13 and second collector semiconductor region 21. The recombination layer 50 is, for example, a silicide layer or a metal layer, which is directly adjacent both to the first emitter semiconductor region 13 and to the second collector semiconductor region 21.

Furthermore, the terminals of the vertically integrated cascode formed by the semiconductor arrangement are shown schematically in FIG. 1. In this case, the first transistor can be connected via the first collector terminal K1 and the first base terminal B1. The regions 60a and 60b can be made hereby, for example, of $SiO_2$. The first collector and, necessarily coupled, the second emitter can also be connected via terminal E1K2 of recombination layer 50. The additional terminals of the second transistor are the second base terminal B2 and the second emitter terminal E2.

Figure 2:
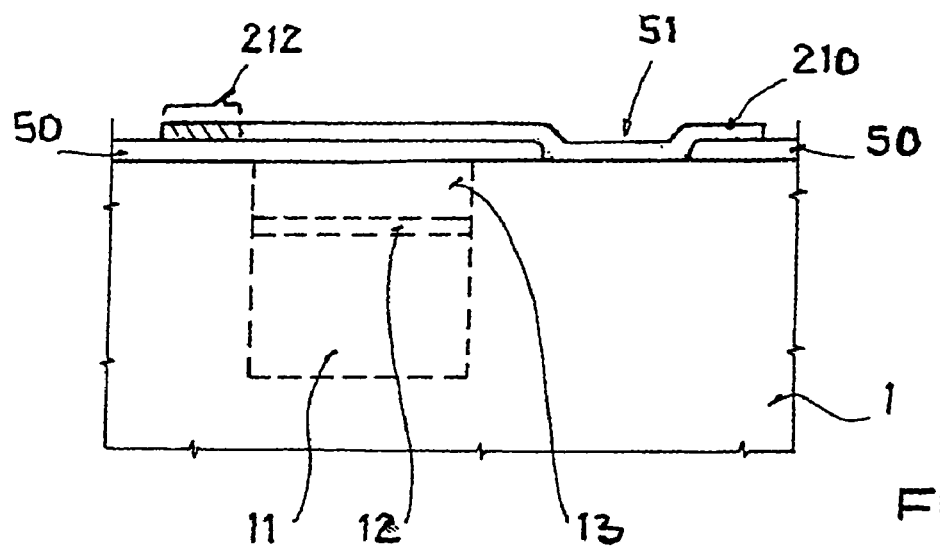
FIG. 2 is a schematic sectional drawing after several manufacturing steps and application of a recombination layer.

FIG. 2 shows schematically an intermediate stage in the manufacture of a semiconductor arrangement of FIG. 1. First collector semiconductor region 11, first base semiconductor region 12, and first emitter semiconductor region 13 have already been introduced into the monocrystalline semiconductor substrate 1, for example, by implantation or epitaxial growth. A suicide layer 50 is formed as recombination layer 50 on the surface of semiconductor substrate 1. An opening 51 is introduced in this suicide layer, so that a surface region of the monocrystalline substrate 1 or an epitaxially applied monocrystalline semiconductor layer (not shown) is exposed. A layer of amorphous silicon is applied to the opening 51 and to silicide layer 50 and is then crystallized to a monocrystalline silicon layer 210.

During the crystallization of amorphous substances, two temperature dependent variables—the nucleation rate and the crystal growth rate—influence the quality and properties of crystallized layer 210. If polycrystalline grains have already formed on a layer, a lateral solid phase epitaxy, progressing from the crystallization nuclei, stops at the grain boundaries. With undoped amorphous Si, in this way, approximately 4 μm can be overgrown laterally, in a monocrystalline manner, and with good crystal quality. It is possible thereby that the lateral expansion of the monocrystalline region is about 10 times the layer thickness. With highly phosphorus-, boron-, or germanium-doped amorphous silicon, in contrast, between 20 μm and 40 μm may be overgrown. Selective etching of a highly doped layer, moreover, can also form thinner layers of crystallized amorphous silicon.

Transition metal impurities, primarily those with nickel, increase the silicon crystal formation rate at low temperatures. The doping with transition metals may be utilized, for example, for manufacturing thin-layer transistors. If thereby free metal ions diffuse from a silicide layer into the overlying amorphous silicon in notable amounts, overgrowing of silicide layers with lateral solid phase epitaxy of silicon appears impossible.

However, for many silicides (50), there is a temperature range within which the lateral solid phase epitaxy, proceeding from a seed opening 51 designated as a crystallization nucleus, leads to a crystal growth rate, whereas at the same time the outward diffusion of transition metal ions from silicide layer 50 into overlying silicon layer 210 is so low that the crystallization rate is not increased to a prohibitively great extent.

The lateral solid phase epitaxy occurs in this case within a temperature range between 400° C. and 600° C., which is selected in keeping with a low rate of diffusion of transition metals from silicide layer 50 into a crystallized monocrystalline semiconductor layer 210, which is made of, for example, of Si or SiGe. Crystallized monocrystalline semiconductor layer 210, obtained by solid phase epitaxy, thereby covers filled seed window 51 and also adjacent regions of silicide layer 50. Crystallized monocrystalline semiconductor layer 210, however, ends at polycrystalline regions 212, which arise by spontaneous crystal formation from the amorphous silicon layer at a distance from seed window 51.

In the next steps (not shown), polycrystalline regions 212 are removed, for example, by appropriate masking and subsequent dry etching. The crystallized, now monocrystalline silicon layer 210 is covered by additional epitaxial application of silicon and hereby or afterwards semiconductor regions 21, 22, and 23 of the second bipolar transistor are formed.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for integrating two bipolar transistors in a semiconductor body, the method comprising the steps of:
    providing, for a first bipolar transistor, a first emitter semiconductor region, a first base semiconductor region, and a first collector semiconductor region;
    applying a recombination layer to the first bipolar transistor, which is adjacent to a first emitter semiconductor region or a first collector semiconductor region and is formed so that charge carriers recombine on the recombination layer; and
    providing a second bipolar transistor on the recombination layer, the second bipolar transistor including a second emitter semiconductor region, a second base semiconductor region, and a second collector semiconductor region,
    wherein the second bipolar transistor is provided on the recombination layer so that the second emitter semiconductor region is adjacent to the recombination layer if the first collector semiconductor region is adjacent to the recombination layer, and the second collector semiconductor region is adjacent to the recombination layer if the first emitter semiconductor region is adjacent to the recombination layer.

2. A method for integrating two bipolar transistors in a semiconductor body, the method comprising the steps of:
    providing, for a first bipolar transistor, a first emitter semiconductor region, a first base semiconductor region, and a first collector semiconductor region;
    applying a recombination layer to the first bipolar transistor, which is adjacent to a first emitter semiconductor region or a first collector semiconductor region and is formed so that charge carriers recombine on the recombination layer; and
    providing a second bipolar transistor on the recombination layer, the second bipolar transistor including a second emitter semiconductor region, a second base semiconductor region, and a second collector semiconductor region,
    wherein the second bipolar transistor is provided on the recombination layer so that the second emitter semiconductor region or the second collector semiconductor region is adjacent to the recombination layer, and
    wherein a silicide layer is formed as the recombination layer, an amorphous semiconductor layer is applied both to the silicide layer and also to an exposed monocrystalline semiconductor region adjacent to the silicide layer, and during a subsequent temperature treatment, the amorphous semiconductor layer is crystallized proceeding from the exposed monocrystalline semiconductor area, which acts as a crystallization nucleus, so that the silicide layer is covered at least partially by a crystallized monocrystalline semiconductor layer.

3. The method according to claim 2, wherein the silicide layer is made of titanium as the transition metal and silicon as the semiconductor material.

4. The method according to claim 2, wherein the amorphous semiconductor layer is crystallized substantially laterally.

5. The method according to claim 4, wherein the crystallization occurs within a temperature range between 400° C. and 600° C.

6. The method according to claim 2, wherein the amorphous silicon layer is applied with a layer thickness of at least 300 nm.

7. The method according to claim 2, wherein at least one region of the amorphous semiconductor layer is doped with at least one dopant, or with germanium, phosphorus, boron, and/or arsenic.

8. The method according to claim 7, wherein regions, doped with the dopant, of the crystallized monocrystalline semiconductor layer are etched selectively, particularly wet chemically, and wherein the regions doped with the dopant have a higher etching rate than a lower doped region of the crystallized monocrystalline semiconductor layer.

9. The method according to claim 2, wherein non monocrystalline regions of the semiconductor layer are selectively removed after crystallization.

10. The method according to claim 9, wherein, after the removal of the non-monocrystalline regions of the semiconductor layer, the crystallized monocrystalline semiconductor layer is thickened by epitaxy or by selective epitaxy, to form the semiconductor regions of the second bipolar transistor.

11. The method according to claim 1, wherein a metal layer is applied as the recombination layer, an amorphous semiconductor layer is applied both to the metal layer and to an exposed monocrystalline semiconductor region adjacent to the metal layer, and wherein during a subsequent temperature treatment, an amorphous semiconductor layer is crystallized proceeding from the exposed monocrystalline semiconductor region, acting as a crystallization nucleus, so that the metal layer is covered at least partially by a crystallized monocrystalline semiconductor layer.

12. The method according to claim 11, the wherein the metal layer is made of molybdenum.

13. The method according to claim 1, wherein the semiconductor arrangement is a superhigh-frequency-capable active component within a frequency range in which the transient behavior is substantially influenced by the Miller effect.

14. The method according to claim 1, wherein the semiconductor arrangement is a high-blocking active component within a voltage range in which the transient behavior is determined substantially by the transit time through a space-charge region between a collector and a base of at least one transistor.

* * * * *